(12) United States Patent
Vernickel et al.

(10) Patent No.: US 12,140,650 B2
(45) Date of Patent: Nov. 12, 2024

(54) INDICATION OF A LOADING STATE OF A FLEXIBLE COIL ELEMENT

(71) Applicant: KONINKLIJKE PHILIPS N.V., Eindhoven (NL)

(72) Inventors: Peter Vernickel, Hamburg (DE); Christian Findeklee, Norderstedt (DE); Christoph Günther Leussler, Hamburg (DE); Oliver Lips, Hamburg (DE); Ingo Schmale, Hamburg (DE); Peter Caesar Mazurkewitz, Hamburg (DE)

(73) Assignee: Koninklijke Philips N.V., Einhoven (NL)

(*) Notice: Subject to any disclaimer, the term of this patent is extended or adjusted under 35 U.S.C. 154(b) by 114 days.

(21) Appl. No.: 17/913,455

(22) PCT Filed: Mar. 24, 2021

(86) PCT No.: PCT/EP2021/057504
§ 371 (c)(1),
(2) Date: Sep. 22, 2022

(87) PCT Pub. No.: WO2021/197943
PCT Pub. Date: Oct. 7, 2021

(65) Prior Publication Data
US 2023/0128603 A1  Apr. 27, 2023

(30) Foreign Application Priority Data

Apr. 1, 2020  (EP) .................................... 20167486

(51) Int. Cl.
*G01R 33/34*  (2006.01)
*G01R 33/54*  (2006.01)

(52) U.S. Cl.
CPC ..... *G01R 33/34084* (2013.01); *G01R 33/546* (2013.01)

(58) Field of Classification Search
CPC ............ G01R 33/34084; G01R 33/546; G01R 33/3415; G01R 33/36; G01R 33/341
See application file for complete search history.

(56) References Cited

U.S. PATENT DOCUMENTS

2008/0007263 A1   1/2008  Machida et al.
2010/0060284 A1   3/2010  Sugiura
(Continued)

FOREIGN PATENT DOCUMENTS

JP   2005124855 A   5/2005

OTHER PUBLICATIONS

Eussler et al "Investigation of Flexible Transmit/Recieve Coil Concepts on B1+ Performance at 3T" Proceedings of the Int. Soc. for Magnetic Reson. in Med. May 15, 2015.
(Continued)

*Primary Examiner* — G. M. A Hyder

(57) ABSTRACT

The invention also refers to a flexible coil element for a flexible coil array, for a magnetic resonance imaging apparatus. The invention also refers to a flexible coil array, for a magnetic resonance imaging apparatus, for indicating a loading state of a flexible coil element being positioned on at least one inductive element. The invention also refers to a method for indicating a loading state of a flexible coil element being positioned on at least one inductive element. The flexible coil element is comprised by a flexible coil array, wherein the flexible coil array comprises at least one flexible coil element. Furthermore, the invention refers to a software package comprising instructions for carrying out the method steps.

15 Claims, 3 Drawing Sheets

(56) References Cited

U.S. PATENT DOCUMENTS

| | | |
|---|---|---|
| 2010/0176800 A1 | 7/2010 | Biber et al. |
| 2013/0119981 A1 | 5/2013 | Choi et al. |
| 2015/0253395 A1 | 9/2015 | Azar et al. |
| 2015/0253404 A1 | 9/2015 | Tomiha et al. |
| 2017/0020409 A1 | 1/2017 | Hengerer et al. |
| 2018/0217213 A1* | 8/2018 | Hausotte ............ G01R 33/3415 |

OTHER PUBLICATIONS

International Search Report and Written Opinion from PCT/EP2021/057504 mailed May 28, 2021.

* cited by examiner

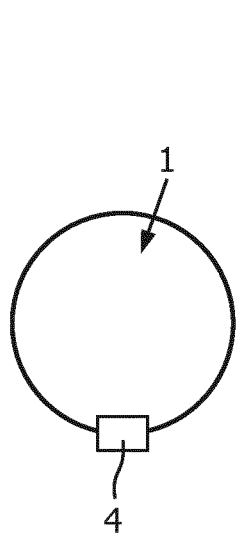  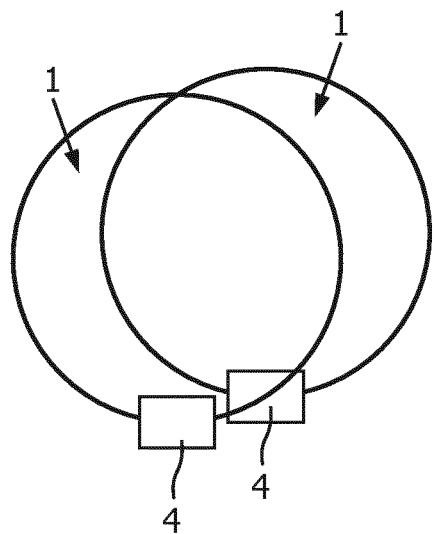
FIG. 2A  FIG. 2B  FIG. 2C
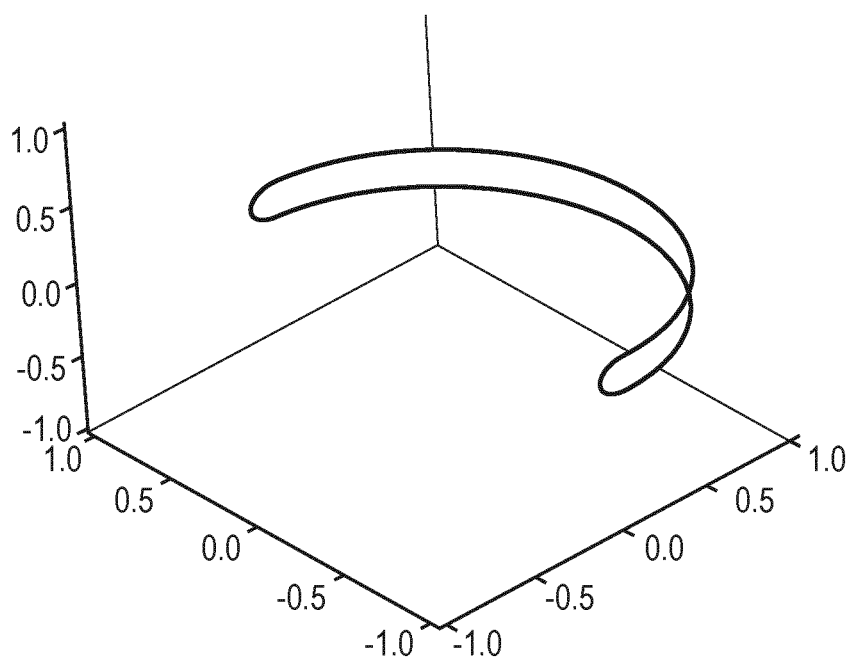
FIG. 3

INDICATION OF A LOADING STATE OF A FLEXIBLE COIL ELEMENT

CROSS REFERENCE TO RELATED APPLICATIONS

This application is a U.S. national phase application of International Application No. PCT/EP2021/057504 filed on Mar. 24, 2021, which claims the benefit of EP Application Serial No. 20167486.8 filed on Apr. 1, 2020 and is incorporated herein by reference.

FIELD OF THE INVENTION

The invention refers to a flexible coil element for a flexible coil array, for a magnetic resonance imaging apparatus.

The invention also refers to a flexible coil array, for a magnetic resonance imaging apparatus, for indicating a loading state of a flexible coil element being positioned on at least one inductive element.

The invention refers to a method for indicating a loading state of a flexible coil element being positioned on at least one inductive element. The flexible coil element is comprised by a flexible coil array, wherein the flexible coil array comprises at least one flexible coil element.

Furthermore, the invention refers to a software package comprising instructions according to the method steps.

BACKGROUND OF THE INVENTION

US 2010/060284 A1 refers to a method, according to which a control unit of a computer system moves a table on which a subject is placed such that the centre of the section selected by receiving the selecting operation via the button is positioned at the centre of a magnetic field.

JP 2005/124855 A refers to a light emitting element being mounted on the upper face of a receiving coil, a light receiving element is mounted on the opening part of a gantry, and when a top plate mounted with the subject and the receiving coil is inserted in the centre of the static magnetic field, the light receiving element detects an optical signal from the light emitting element to find the position of the top plate, then the top plate is moved by a predetermined distance which is determined by the shape of the gantry and the subject and the receiving coil are inserted in the centre of the static magnetic field.

US 2008/007263 A1 refers to a magnetic resonance imaging apparatus including an array coil in which a plurality of element coils are arranged to receive magnetic resonance signals from a subject, a calculation unit which calculates projection data for the element coils regarding an arrangement direction of the plurality of element coils on the basis of the plurality of magnetic resonance signals received by the plurality of element coils, and a determination unit which determines the positions of the plurality of element coils or the position of the array coil on the basis of the projection data for the plurality of element coils.

US 2015/253404 A1 refers to a magnetic resonance imaging apparatus including a wireless communication unit, a radio frequency (RF) coil, and a specifying unit.

US 2017/020409 A1 refers to a medical imaging apparatus is designed to acquire medical imaging data of a patient during a medical imaging examination and has a medical data acquisition scanner, which has a patient reception area at least partially enclosed by the scanner, inside of which a body area of a patient for examination is situated during the medical imaging examination.

The US patent application US2018/0217213 discloses an indicator array on a local coil assembly. The indicator array is designed to display a signal that shows activity of a respective coil of two or more coils.

SUMMERY OF THE INVENTION

Based on this, it is the purpose of the invention to provide improved means for a magnetic resonance imaging apparatus. Particularly, it is the purpose of the invention to provide a more intuitive and simple aid for the correct placement of the flexible coil array. This problem is solved by the subject-matter of claim 1. Preferred further embodiments are found in the dependent claims.

According to the invention, it is provided a flexible coil element for a flexible coil array, for a magnetic resonance imaging apparatus. The flexible coil element is configured for being positioned on at least one inductive element and to generate a magnetic frequency signal. The flexible coil element comprises measuring means configured to measure the magnetic frequency signal which is received by the coil element; and for indicating a loading state of the flexible coil element, signal means configured to emit a human perceptible signal, wherein properties of the human perceptible signal are generated dependent on properties of the measured magnetic frequency signal.

In other words, the coil element is meant to be a single loop which acts as an antenna and/or receiver, for example.

According to the invention, it is also provided a flexible coil array, for a magnetic resonance imaging apparatus, for indicating a loading state of a flexible coil element when being positioned on at least one inductive element. The flexile coil array comprises at least one flexible coil element configured for being positioned on at least one inductive element; frequency generating means configured to generate a magnetic frequency signal; measuring means configured to measure the magnetic frequency signal which is received by at least one coil element; and signal means configured to emit, for each of the flexible coil elements of the flexible coil array, a human perceptible signal, wherein properties of the human perceptible signal are generated dependent on properties of the measured magnetic frequency signal.

In other words, the coil array is a collection of several coil elements. The coil array has to be placed on an object to be imaged.

Additionally, the flexible coil array may comprise any of the features of the flexible coil element according to any of the preferred embodiments.

According to the invention, it is also provided a method for indicating a loading state of a flexible coil element being positioned on at least one inductive element, wherein the flexible coil element is comprised by a flexible coil array, wherein the flexible coil array comprises at least one flexible coil element. The method comprises the following steps: generating, by frequency generating means, a magnetic frequency signal; measuring, by measuring means, the magnetic frequency signal which is received by at least one coil element; and emitting, by signal means, for each of the flexible coil elements of the flexible coil array, a human perceptible signal, wherein properties of the human perceptible signal are generated dependent on properties of the measured magnetic frequency signal.

The human perceptible signal is emitted for each of the flexible coil elements independently.

Additionally, the method may comprise method steps according to the features of the flexible coil element or the flexible coil array according to any of the preferred embodiments.

According to the invention, it is also provided a software package comprising instructions for carrying out method steps on a computing system according to the method according to the invention. The software package may be provided as an update, for example.

Additionally, the software package may comprise instructions according to method steps according to features of the flexible coil element or the flexible coil array according to any of the preferred embodiments.

The flexible coil element/flexible coil array may be comprised by a magnetic resonance imaging apparatus.

The basic idea of the invention is to show a user immediately when placing individual flexible coil elements whether the placement is correctly arranged with respect to inductive elements. The correct placement can be indicated to the user by an acoustic or optical signal. The correct arrangement of the flexible structure is considerably simplified and an effective operation of the flexible coil elements can be made possible with advantage. Furthermore, in case that a large flexible coil array is used to image a small object, such as a foot, it might be intended that not all coil elements are loaded and contribute to imaging. The signal means, such as optical signal means in the form of LED indicators, leave it to the user to react or not. Advantageously, the invention thereby overcomes any automatic means which would try to adapt the tuning of the array in an unintended way.

According to a preferred embodiment, the frequency signal is a pilot signal or a noise signal. The pilot signal may be a frequency-sweep signal. The noise signal may be in a selected bandwidth. The magnetic frequency signal may be provided by an external device, such as a patient table, or it may be provided by the flexible coil element. In the latter case, the flexible coil element may comprise energy storage means. The magnetic frequency signal may be in the range of the Larmor frequency, wherein the frequency may deviate from the Larmor frequency in the range of 100 or more 100 kilohertz. The system of the flexible coil element/flexible coil array and the method can thus be flexibly adapted to specific application situations.

According to a preferred embodiment, the signal means configured to emit the human perceptible signal is an Augmented Reality (AR) system or a beamer; or a light-emitting diode (LED), wherein properties of a light signal of the LED depend on the positioning of the flexible coil element on the inductive charging element. Augmented reality is the computer-aided extension of the perception of reality. This information can address all human sensory modalities. AR systems may be used to overlay colour indicators, such as a LED or they may be used to provide a more sophisticated feedback, for example in combination with other signal means. The human perceptible signal can be adapted to specific applications. For example, it is conceivable that a visual signal is more appropriate in a room with a lot of background noise or, conversely, an acoustic signal is more appropriate in a room with a lot of light.

According to a preferred embodiment, the signal means is configured to emit a type of the human perceptible signal depending on whether: the flexible coil element is centred on the inductive element; or the flexible coil element is bent or deformed; or one or more flexible coil elements are arranged on top of each other. Under consideration of certain scenarios, which would significantly impair a measurement with the flexible coil array, a signal type can be selected, which is then clearly assigned to a case. Depending on the requirements on an accuracy of the measurement by the flexible coil array, signals can be provided for more or less cases of an unfavourable arrangement of the flexible coil array. In this way, the user can consciously exclude sources of error. The user-friendliness is thus increased and at the same time the reliability of the measurements is guaranteed.

According to a preferred embodiment, the human perceptible signal is a user instruction to reposition or rearrange the flexible coil element; or to maintain position or arrangement of the flexible coil element. The user instruction may be, for example, a demand for moving the whole array with respect to regions of interest (ROI) in combination with a vital eye camera system. Beamers may be used to project colour indicators onto the coil elements or they may provide more sophisticated feedback. Thus, the user can be directly instructed how to improve the position. This reduces the time needed to arrange the flexible coil element/array correctly.

According to a preferred embodiment, the frequency generating means comprises the at least one flexible coil element and/or the at least one inductive element. The advantage is that the flexible coil element, if it is the magnetic frequency generating means, can be particularly compact. In other cases, i.e. if the magnetic frequency generating means is the inductive element, the inductive element can be designed specifically to generate a pilot signal.

According to a preferred embodiment, the method comprises, after the step of generating, by the frequency generating means, the frequency signal, a step of sampling, by the flexible coil element, the frequency signal within a bandwidth range. For example, the coil array may sample the signal within a possible bandwidth. Furthermore, temporal averaging and de-bouncing may be applied. In case that the signal means is supplied by energy of the frequency generating means, flickering of signals of the signal means, such as the LED, can be avoided.

According to a preferred embodiment, the method comprises, after the step of measuring, by measuring means, the magnetic frequency signal, a step of comparing, by controlling means, a curve shape of the frequency signal with at least one stored pattern, wherein the properties of the human perceptible signal are selected based on one of the at least one stored pattern which has most similarities with the curve shape of the frequency signal. Such step may comprise that sampled signals are evaluated. In case of a LED, depending on a most matching pattern, a LED colour is selected. This allows a user to react in accordance with the signal. For example, in case of a multi-purpose array, imperfect loading conditions of a coil may be intended.

According to a preferred embodiment, the method comprises emitting, by the LED, for each of the flexible coil elements of the flexible coil array, a light signal, wherein properties of the light signal are generated dependent on the positioning of the at least one flexible coil element on the at least one inductive charging element. The LED may be placed inside a translucent housing comprising the coil array, or directly point to the outside. This provides feedback during the coil array placement to the user. For example, the LED(s) may be illuminated in green in case that (all) coil element(s) couple to a tissue. In such a case, the coil loading is in an intended range. Alternatively, (a) LED(s) assigned to (a) coil(s) may be illuminated in red in case that the respective coil being assigned to the LED is not intendedly placed at the tissue. The tissue may be a human tissue, such as the chest.

In the following, the invention is further explained in detail on the basis of a preferred design example with reference to the drawings.

BRIEF DESCRIPTION OF THE DRAWINGS

In the drawings

FIG. 2A schematically shows a flexible coil element according to an implementation example in a normal state;

FIG. 2B schematically shows the flexible coil element according to the implementation example in a deformed state;

FIG. 2C schematically shows two of the flexible coil elements according to the implementation example in an overlapped state;

FIG. 3 schematically shows a flexible coil element according to an implementation example in a folded state;

DETAILED DESCRIPTION OF EMBODIMENTS

Figure 1:
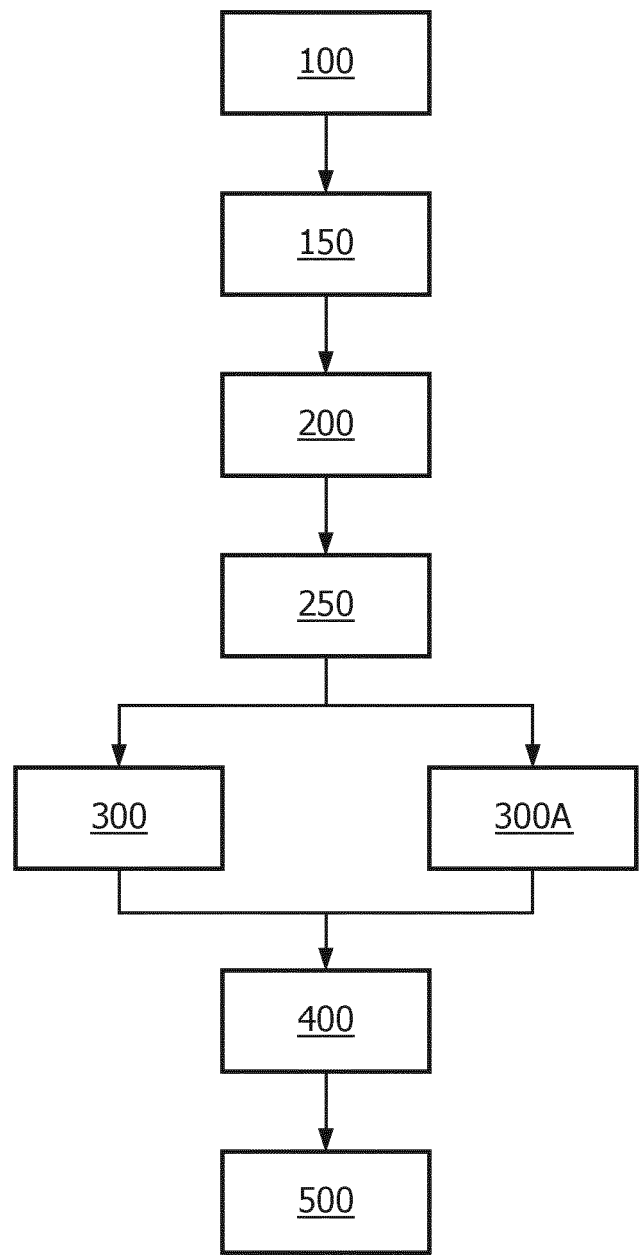
FIG. 1 shows a flow chart of a method according to an implementation example.

FIG. 1 shows a flow chart of a method according to an implementation example. The method comprises the steps 100, 150, 200, 250, and 300. Alternatively, the method comprises the steps 100, 150, 200, 250, and 300A. Furthermore, the method comprises steps 400 and 500, which are included in both alternatives.

In the beginning, the coil elements may be enabled. For example, they may be enabled by connecting a plug to the coil array 2.

According to a step indicated by the reference number "100", the method comprises generating, by frequency generating means, a magnetic frequency signal. In particular, a frequency sweep signal is generated from the inside of a patient table. The magnetic frequency signal comprises a frequency in a range of the Larmor frequency or deviating in a kilohertz range from the Larmor frequency. The frequency signal is similar to the tune signal of the body coil. Alternatively, the signal can also be generated by the coil itself which allows for performing these measurements without connecting the coil to the system i.e. in a preparation room. For this purpose, the coil is equipped with a battery to perform this measurement autonomously.

According to a step indicated by the reference number "150", the method comprises sampling, by the flexible coil element, the frequency signal within a bandwidth range. In other words, the coil array(s) 2 sample(s) the signal within the possible bandwidth. Furthermore, temporal averaging and de-bouncing is applied to avoid flickering of the signal means.

According to a step indicated by the reference number "200", the method comprises measuring, by measuring means, the magnetic frequency signal which is received by at least one coil element.

According to a step indicated by the reference number "250", the method comprises comparing, by controlling means, a curve shape of the frequency signal with at least one stored pattern. More particularly, the curve shape of the sampled signals is evaluated and matched against a known pattern.

According to a step indicated by the reference number "300", the method comprises emitting, by signal means, for each of the flexible coil elements of the flexible coil array, a human perceptible signal.

Alternatively, according to a step indicated by the reference number "300A", the method comprises emitting, by the LED, for each of the flexible coil elements of the flexible coil array, a light signal. In case of a LED, depending on the most matching pattern the LED color is selected. The user can then react depending on the colors. In case of a multi-purpose array, imperfect loading conditions may be intended.

According to a step indicated by the reference number "400", the method comprises triggering, by controlling means, a start of a scan measurement.

According to a step indicated by the reference number "500", the method comprises turning off, by the controlling means, the signal means/LED and a loading measurement of the flexible coil elements. In other words, when the scan is intended to start, for example indicated by moving the patient table, or a user input, the method comprises sweeping of the signal, and with it the measurement LED lighting stops.

Digital preamplifiers with a radio frequency (RF) in and out and the corresponding local control logic allow to perform the measurement and the LED lighting locally without the need to connect to the scanner frontend.

Under certain circumstances, it is possible to derive the loading condition from sampling noise in the given bandwidth, instead of requiring a piloting signal.

FIG. 2A schematically shows a flexible coil element 1 according to an implementation example in a normal state and FIG. 2B schematically shows the flexible coil element 1 according to the implementation example in a deformed state which can occur when the coil array is squeezed. The rectangular elements are preamplifier 4. The flexible coil element 1 has a circular shape in its normal state. In case of a deformed state the flexible coil element 1 is bent. FIG. 2C schematically shows two of the flexible coil elements 1 according to the implementation example in an overlapped state, which can result when the flexible array is wrapped around an arm or a leg.

FIG. 3 schematically shows a flexible coil element according to an implementation example in a folded state. In this particular case the flexible coil element is folded to form a half circle.

Figure 4A:
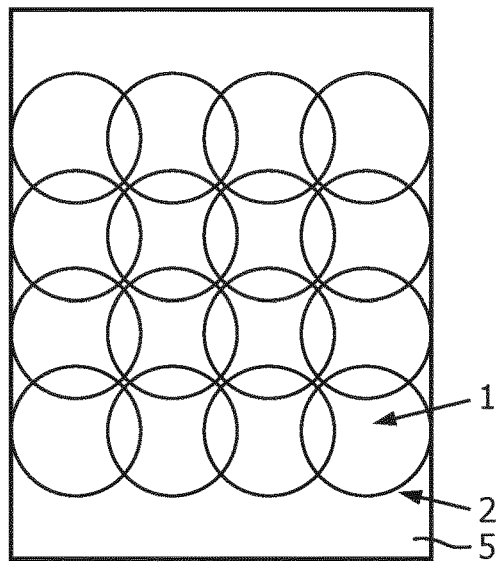
FIG. 4A schematically shows a flexible coil array according to an implementation example being centred on a tissue.

FIG. 4A schematically shows a flexible coil array 2 according to an implementation example being centred on a tissue 5. The tissue 5 may be human tissue, such as the chest. The flexible coil array 2 comprises light emitting diodes (LED) as signal means. All LEDs light up in the same colour, such as green (not shown). Thereby, it is indicated to a user that all flexible coil elements 1 couple to the tissue 5 and that a coil loading of each of the flexible coil elements 1 is in an intended range. The array is equipped with coloured LED per coil element 1, indicating the (RF wise) status of it.

Figure 4B:
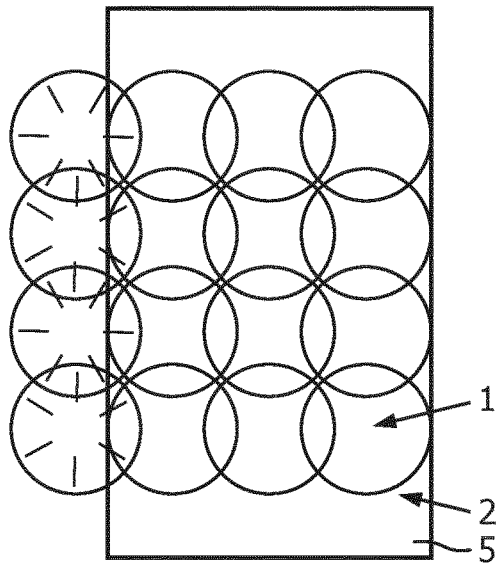
FIG. 4B schematically shows the flexible coil array according to the implementation example being displaced respective to the tissue.

FIG. 4B schematically shows the flexible coil array 2 according to the implementation example being displaced respective to the tissue 5. The LEDs light up in different colours, such as green (not shown) and red (indicated by the beams in the left column of flexible coil elements). In the area of the flexible coil array 2, in which loading is determined to be in the intended range, the LEDs light up in green colour (not shown). However, the coil loading of the left column of the flexible coil elements 1 is determined to be too low. In such case, LEDs lighting up in red colour (beams in FIG. 4B) demand for replacement if applicable. For example, in case that a large flexible coil array is used to image a small object, such as a foot, it might be intended that not all coil elements are loaded and contribute to imaging. LED indicators leave it to the user to react or not. For example, the user could centre the coil array 2 with respect to the tissue 5, or use straps to wrap the flexible coil elements 1 around a body, which is situated below the tissue 5.

Figure 4C:
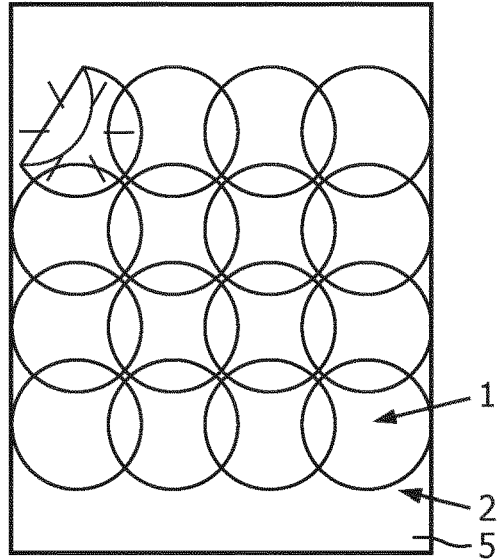
FIG. 4C schematically shows the flexible coil array according to the implementation example, wherein one flexible coil element is folded.

FIG. 4C schematically shows the flexible coil array 2 according to the implementation example, wherein one flexible coil element 1 is folded. In other words, the flexible coil array 2 is folded on top of itself. The LEDs light up in different colours, such as green (not shown) and blue (indicated by the beams in the coil element in the left upper corner of the array). In the area of the flexible coil array 2, in which loading is determined to be in the intended range, the LEDs light up in green colour (not shown). Further, it is indicated by a blue light (indicated by the beams) in the area of the folded coil element 1 that the flexible coil element 1 is folded, demanding a user to flatten the flexible coil array 2 if possible.

REFERENCE SIGNS 1 flexible coil element
2 flexible coil array
3 signal means
4 preamplifier
5 tissue
100 generating, by frequency generating means, a magnetic frequency signal
150 sampling, by the flexible coil element, the frequency signal within a bandwidth range
200 measuring, by measuring means, the magnetic frequency signal which is received by at least one coil element
250 comparing, by controlling means, a curve shape of the frequency signal with at least one stored pattern
300 emitting, by signal means, for each of the flexible coil elements of the flexible coil array, a human perceptible signal
300A emitting, by the LED, for each of the flexible coil elements of the flexible coil array, a light signal
400 triggering, by controlling means, a start of a scan measurement
500 turning off, by the controlling means, the signal means/LED and a loading measurement of the flexible coil elements

The invention claimed is:

1. A coil element for a flexible coil array, for a magnetic resonance imaging apparatus, the flexible coil element configured to be positioned on at least one inductive element; and
configured to measure a magnetic frequency signal which is received by the coil element, wherein the flexible coil element comprises:
signal emitter for indicating a loading state of the flexible coil element and configured to emit a human perceptible signal, wherein properties of the human perceptible signal are generated dependent on properties of the measured magnetic frequency signal.

2. The flexible coil element according to claim 1, wherein the frequency signal is a pilot signal or a noise signal.

3. The flexible coil element according to claim 1 wherein the signal emitter configured to emit the human perceptible signal is
an Augmented Reality (AR) system or a beamer; or
a light-emitting diode (LED), wherein properties of a light signal of the LED depend on positioning of the flexible coil element on an inductive charging element.

4. The flexible coil element according to claim 1, wherein the signal emitter is configured to emit a type of the human perceptible signal depending on whether: the flexible coil element is centred on the inductive element; or the flexible coil element is bent or deformed.

5. The flexible coil element according to claim 1, wherein the human perceptible signal is a user instruction to reposition or rearrange the flexible coil element; or to maintain position or arrangement of the flexible coil element.

6. Flexible coil array for a magnetic resonance imaging apparatus, for indicating a loading state of a flexible coil element when being positioned on at least one inductive element, the flexile coil array comprising several flexible coil elements according to claim 1.

7. The flexible coil array according to claim 6, wherein the signal emitter is configured to emit a type of the human perceptible signal depending on whether one or more flexible coil elements are arranged on top of each other.

8. A magnetic resonance imaging apparatus comprising: a flexible coil array as claimed in claim 7.

9. The flexible coil element according to claim 6, wherein the frequency generator comprises: the at least one flexible coil element and/or the at least one inductive element.

10. The flexible coil element according to claim 1 comprising: a frequency generator to generate the magnetic frequency signal.

11. A method for indicating a loading state of a flexible coil element positioned on at least one inductive element, wherein the flexible coil element includes a flexible coil array, wherein the flexible coil array and at least one flexible coil element the method comprising the following steps:
generating, a magnetic frequency signal;
measuring, the magnetic frequency signal which is received by at least one coil element; and
emitting, by a signal emitter, for each of the flexible coil elements of the flexible coil array, for indicating a loading state of the flexible coil element, a human perceptible signal, wherein properties of the human perceptible signal are generated dependent on properties of the measured magnetic frequency signal.

12. The method according to claim 11, comprising, after the step of generating, the magnetic frequency signal, a step of sampling, by the flexible coil element, the frequency signal within a bandwidth range.

13. The method according to claim 11, comprising, after the step of measuring the magnetic frequency signal, a step of comparing, a curve shape of the frequency signal with at least one stored pattern, wherein the properties of the human perceptible signal are selected based on one of the at least one stored pattern which has most similarities with the curve shape of the frequency signal.

14. The method according to claim 11,
wherein the human perceptible signal is a light signal and the signal emitter is an LED, and properties of the light signal generated depend on the positioning of the at least one flexible coil element on the at least one inductive element.

15. A software package comprising: instructions stored on a non-transitory computer readable medium for controlling a computing system to carry out the method according to claim 11.

* * * * *